United States Patent
Goodell et al.

(10) Patent No.: US 6,433,613 B1
(45) Date of Patent: Aug. 13, 2002

(54) TRANSLATING SWITCH CIRCUIT WITH DISABLING OPTION

(75) Inventors: Trenor Goodell, Peaks Island; James Boomer, Falmouth, both of ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/737,977

(22) Filed: Dec. 15, 2000

(51) Int. Cl.$^7$ ............................................. H03K 17/687
(52) U.S. Cl. ....................... 327/427; 327/387; 327/389; 326/57
(58) Field of Search ................... 327/419, 427, 327/379, 384, 387, 389, 530, 534, 535, 309, 310, 391; 326/49, 57

(56) References Cited

U.S. PATENT DOCUMENTS

| | | | |
|---|---|---|---|
| 5,963,080 A | * 10/1999 | Miske et al. ................ | 327/534 |
| 6,052,019 A | * 4/2000 | Kwong ........................ | 327/437 |
| 6,256,182 B1 | * 7/2001 | Suzuki et al. ............... | 361/93.9 |

* cited by examiner

*Primary Examiner*—Timothy P. Callahan
*Assistant Examiner*—Minh Nguyen
(74) *Attorney, Agent, or Firm*—Cesari and McKenna, LLP; Edwin H. Paul, Esq.

(57) ABSTRACT

A translation switch is described with a transfer MOS transistor that connects a first node to second node where the first node is referenced to a higher voltage than is the second. A pseudo-rail generator drives the gate of the MOS transistor and provides a p-rail reference voltage lower in voltage to that of the first node. The generator includes a selectively enabled active clamping circuit that clamps the gate of the MOS transfer transistor to the p-rail potential and sinks current from the p-rail when higher voltages appear on the p-rail to thereby maintain the p-rail at a substantially constant potential.

26 Claims, 7 Drawing Sheets

TRANSLATING SWITCH CIRCUIT WITH DISABLING OPTION

BACKGROUND OF THE INVENTION

1. Field of the Invention

The present invention relates to circuitry for switching electrical signals transmitted from one location to another. More particularly, the present invention relates to switch circuitry for translating electrical signals at a first potential into corresponding electrical signals at a second potential different from the first potential. The present invention includes a disablement option for selective activation of the translation switch circuitry.

2. Description of the Prior Art

Output buffers are used to transfer electrical signals of desired amplitude and strength. Signal transfers occur by way of buses—interfaces that couple together active devices that are either on the same semiconductor-based chip or on different chips. The devices may be located proximate to one another, or they may be some relative distance from one another. Among other uses, output buffers including those employed to translate electrical signals on a particular computing system board or among a plurality of circuit boards of a computing system.

Developments in semiconductor technology have created the capability to produce low-cost, highly reliable switches that are, effectively, implementations of mechanical relays. They have been found to be of particular use, when implemented, as single pole, single throw, type relays, but are not limited thereto. Semiconductor switches are used as replacements for the prior mechanical relays, due to the high switching speed available as well as their ability to transfer relatively high currents without failure. These switches are often referred to as transfer gates or pass transistors as they employ the characteristics of transistors—usually MOS transistors—to either permit or prevent the passage of a signal.

It is well known that semiconductor switches are widely used in many fields. They are used in all variety of large- and small-scale consumer products, including, but not limited to, automobiles and home electronics. They can be and are used as analog routers, gates, and relays. They are used as digital multiplexers, routers, and gates as well.

A number of prior-art transfer gates or semiconductor switches have been developed for digital and analog applications. These switches are increasingly being called upon to transfer electrical signals to systems that are powered by power supplies at potentials different from the potentials associated with the input electrical signals. As a result, it is necessary to have switches that can convert or translate electrical signals at one potential to corresponding signals at a different potential, at least with respect to the potential associated with a logic HIGH. As is well known by those in this field, the difference in the potentials associated with a logic HIGH signal and a logic LOW signal may be as small as 0.4V or as great as 5V. For Complementary Metal Oxide Semiconductor (CMOS) based logic for example, a logic high corresponds to a nominal 5.0V potential (for a 5.0V power supply) and a nominal 3.3V potential (for a 3.3V power supply), while a logic low is essentially equivalent to ground (GND) or 0.0V.

The potentials associated with HIGH and LOW signals described above are idealized values. In fact, the signal potentials generally fall within a range of potentials associated with the indicated values. Thus, for a 3.3V supply, a HIGH signal may be supplied at 2.6V, for example, while a LOW signal may actually be associated with a 0.7V value. As the potentials of the power supplies used to power circuitry move closer to GND, variations in signal potentials are more likely to produce transmission glitches. It is therefore desirable to maintain signal potentials as stable as possible. Alternatively or in addition, it is important to design the semiconductor switch to be less sensitive to signal variations but without sacrificing operating capability, i.e., propagation rates and signal amplitudes. This is particularly noteworthy for translation circuitry where the disparity in logic HIGH potentials can be on the order of 1.7V as indicated above.

One example of a typical potential translating bus switch is shown in FIG. 1. The bus 1 includes a set of 12 switch structures SW1–SW12, each of which is designed to transfer a bit of information from individual input nodes a1–a12 to corresponding individual output nodes b1–b12. Nodes a1–a12 are coupled to extended circuitry (not shown) having a power supply at a first potential and nodes b1–b12 are coupled to extended circuitry (not shown) having a power supply at a potential less than that of the extended circuitry coupled to nodes a1–a12. Of course, it is to be understood that the bus may comprise more or fewer switch sets as a function of the number of bits to be propagated.

As illustrated in FIG. 2, an exemplar one of the switch structures, switch SW1, is shown coupled between node a1 and node b1. The other switch structures may be similarly configured. Extended circuitry coupled to node a1 is powered by a high-potential supply Vcc1 and extended circuitry coupled to node b1 is powered by a high-potential supply Vcc2 that is less than the potential associated with Vcc1. Both are coupled to a common low-potential rail GND.

The switch SW1 includes a transfer transistor M1 having a source coupled to node b1 and a drain coupled to node a1. The transistor M1 is preferably an NMOS transistor. The transfer transistor M1 is designed, when enabled by a transfer switch-enabling signal at enable node EN, to propagate electrical signals from node a1 to node b1. The transfer transistor M1 includes a bulk or backwell coupled to a low-potential power rail GND that is common to the extended circuitry associated with nodes a1 and b1. The switch SW1 further includes a first inverter IV1 and a second inverter IV2. The first inverter IV1 is coupled between Vcc1 and GND and includes an input coupled to node EN. Second inverter IV2 includes a complementary pair of inverter transistors M2 and M3. Transistor M2 is a PMOS transistor having a gate coupled to the output of IV1, a source coupled to a pseudo high-potential power rail Prail, and a drain that is, effectively, node C. Transistor M3 is an NMOS transistor having its gate also coupled to the output of IV1, its source coupled to GND, and its drain coupled to node C. The potential of Prail establishes the potential of the output of IV2 to the gate of M1 and so by definition is less than the potential of Vcc1.

With continuing reference to FIG. 2, the potential of Prail is established in the prior art by a diode drop across diode D1. Diode D1 has a high potential node coupled to Vcc1 and a low-potential node coupled to resistor R. The output of forward-biased diode D1 supplies a potential to the source of M2 that is transferred, with a second drop associated with that transistor, to the gate of M1. That arrangement is sufficient to produce a suitable translation of the signal potential from a1 to b1.

Unfortunately, the design of the switch circuit as shown in FIG. 2 has an important limitation if there is any interest in using the switch to propagate transient signals rather than steady state signals. Specifically, noise on Prail that changes the potential of that rail can result in translation errors at the corresponding b nodes when logic signal transitions occur. That noise is caused by multiple simultaneous logic-LOW-to-logic-HIGH transitions on the inputs a1–a12. The noise causes current to be injected onto Prail through the drain/gate capacitance of the corresponding large transfer transistor represented by transistor M1 in FIG. 2. As the voltage on one side of the effective capacitor of that transistor changes, the voltage on the other side of the capacitor also changes—unless it is fixed to a power rail or a voltage reference.

Diode D1 will not restrict the voltage changing on the gate of transistor M1. Resistance R acts to restrict the voltage change in a sense, but it has much lower impedance than the effective capacitor at edge rate frequencies of interest. As a result, the voltage on the gate of transistor M1 will rise. For each of the inputs, the gates of the respective primary translation transistor will attempt to rise with a LOW-to-HIGH transition. That potentially detrimental rise is magnified when multiple inputs switch substantially simultaneously, rendering the likelihood of overshoot more possible. There is a time delay associated with that overshoot. That time delay is defined by the RC time constant associated with the parasitic capacitance associated with the diode clamp, the gate capacitance of M1, and the capacitance of driver circuitry. The delay is unacceptable when it exceeds the switching rates desired in transition-capable switches. For that reason, many switch circuits such as that shown in FIG. 2 are less than suitable for adequate switching of transient signals.

Therefore, what is needed is a translation switch circuit that includes a pseudorail potential generator suitable for establishing a potential level suitable for the translation of an electrical signal at one potential to an electrical signal of the same logic condition but at a lower potential. Further, what is needed is such a translation switch circuit having the means to clamp the pseudorail potential at a desirable level including under transient noise conditions on that rail during signal rising edges. The switch circuit with those characteristics relatedly includes means to rapidly remove excess current from the pseudorail with very little delay so that the translation circuit may be employed to propagate transient translation signals. More generally, it would be desirable to have a translation switch circuit that may be selectably enabled for translation of the signal from the input node to the output node when required, but that would otherwise permit propagation of an electrical signal between those nodes without translation.

SUMMARY OF THE INVENTION

It is an object of the present invention to provide a translation switch circuit that includes a pseudorail potential generator suitable for establishing a potential level suitable for the translation of an electrical signal at one potential to an electrical signal of the same logic condition but at a lower potential. Further, it is an object of the present invention to provide a translation switch circuit having the means to clamp the pseudorail potential at a desirable level including under transient noise conditions on that rail during signal rising edges. It is another object of the present invention to provide a translation switch having the means to rapidly remove excess current from the pseudorail with very little delay so that the translation circuit may be employed to propagate transitioning translation signals. More generally, it is another object of the present invention to provide a translation switch circuit that may be selectably enabled for translation of the signal from the input node to the output node when required, but that otherwise permits propagation of an electrical signal without translation.

These and other objects are achieved in the present invention by the introduction of an active clamping element to the pseudorail generator circuit to replace the passive resistance device described with respect to the switch of FIG. 2. Specifically, the clamping element is designed to be barely on when the switch is operational. As current on the pseudorail increases, the clamping element is turned on more completely. It is preferably designed to be a current amplifier and so it will sink current from the pseudorail much more quickly than is possible with a resistance. Although a variety of arrangements of the clamping element are described more fully herein, one preferably arrangement includes a MOS transistor in combination with a bipolar Darlington pair. That combination generates little power consumption when the current feedback from the pseudorail is stable, but it can very quickly sink current when noise on that rail threatens to disrupt the translation of the electrical signal propagated from one node to another. Moreover, the combination does not adversely impact the standard functionality of the pseudorail in that it provides the necessary potential drop from the potential of the higher supply rail to the gate of the transfer transistor of FIG. 2. The active clamping element permits the translation switch circuit that includes it to be used for transient as well as steady state signal translation. The active clamping element of the present invention may be deployed as a single circuit associated with a single pseudorail that may be used with a plurality of switches in parallel. Alternatively, a plurality of switches may be coupled each to their own pseudorail and corresponding active clamping element. Using a single active clamping mechanism for each switch ensures that each switch would be isolated from one another. When coupled in parallel to the pseudorail, there may be linkage among the switches.

A related but distinct aspect of the present invention is a translation disabling means to be used when the switch circuit is not required to translate an electrical signal from a first potential to a lower second potential. It is desirable in some instances to be able to provide a switch circuit of generic design that may be employed in situations where translation is required and in situations where it is not. For that reason, the present invention includes a biasing bypass circuit that has an output coupled to the pseudorail. However, rather than providing at least one diode drop to that pseudorail, the bypass circuit couples the pseudorail directly to the high potential supply rail. The input to the bypass circuit is coupled to control logic for disablement of the potential reducing generator when the potential to the gate of the transfer transistor is to be substantially full rail-to-rail. Otherwise, the pseudorail generator operates as indicated. However, it is to be understood that the bypass circuit may be employed in combination with any sort of current regulator for the pseudorail. Specifically, it may be used with a circuit such as the prior-art switch of FIG. 2 or it may be used with an active clamping element such as those described herein.

These and other advantages of the present invention will become apparent upon review of the detailed description, the accompanying drawings, and the appended claims.

DESCRIPTION OF THE PREFERRED EMBODIMENTS OF THE INVENTION

Figure 1:
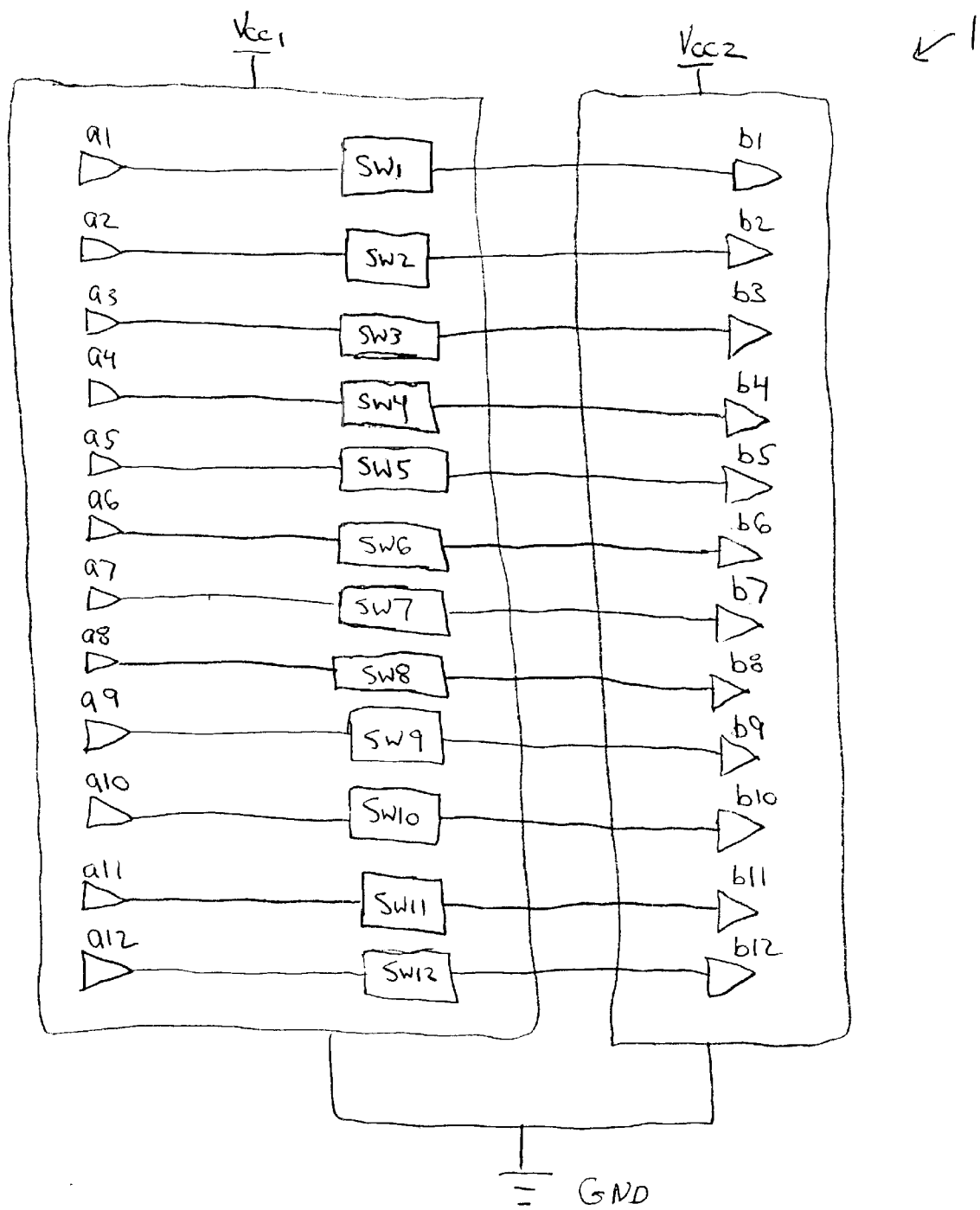
FIG. 1 is a simplified representation of a related translating bus switch for propagating electrical signals representing individual bits.
Figure 2:
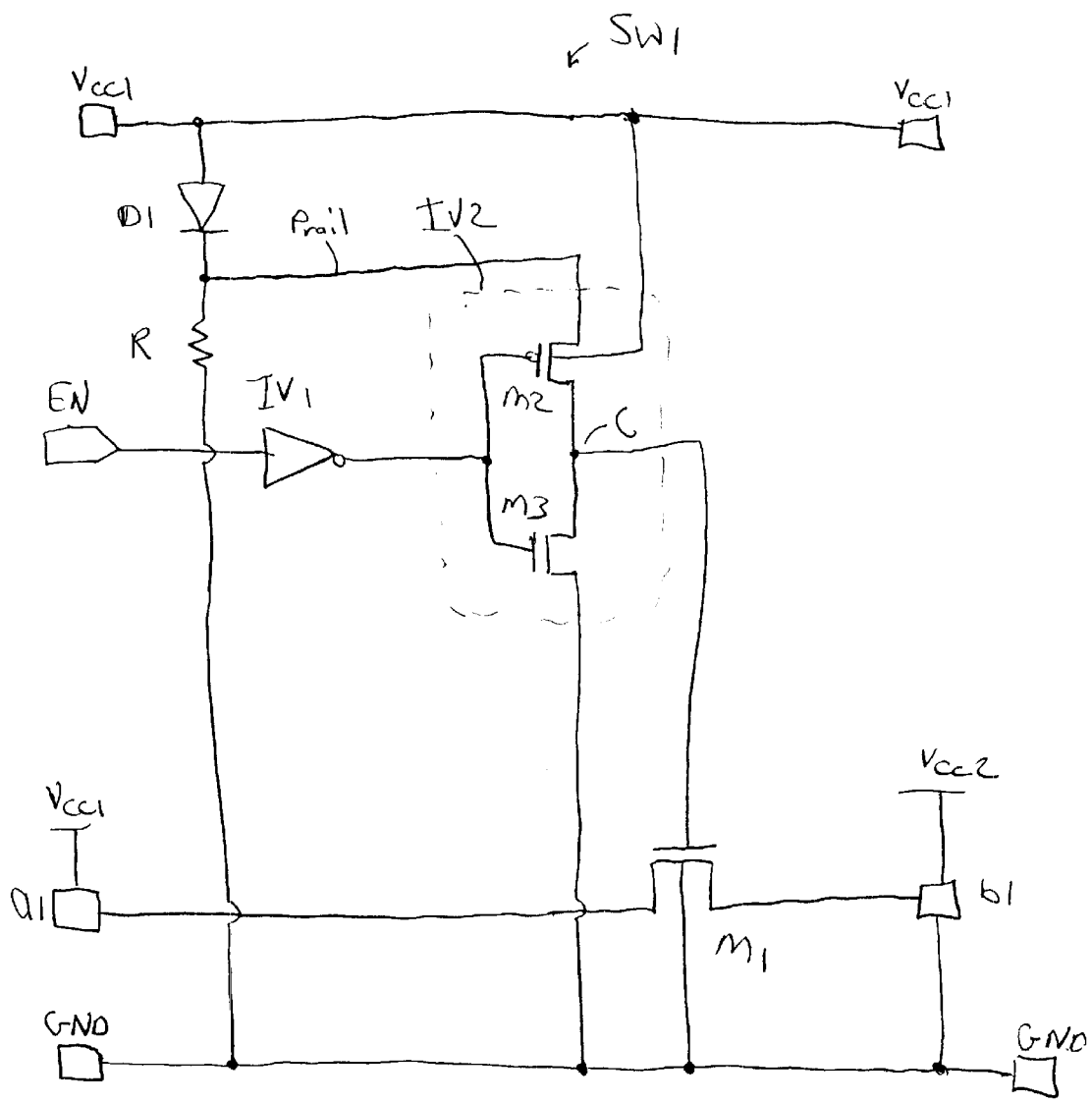
FIG. 2 is a simplified circuit diagram showing the design of an exemplar prior-art translation switch circuit including a pseudorail generating subcircuit.
Figure 3:
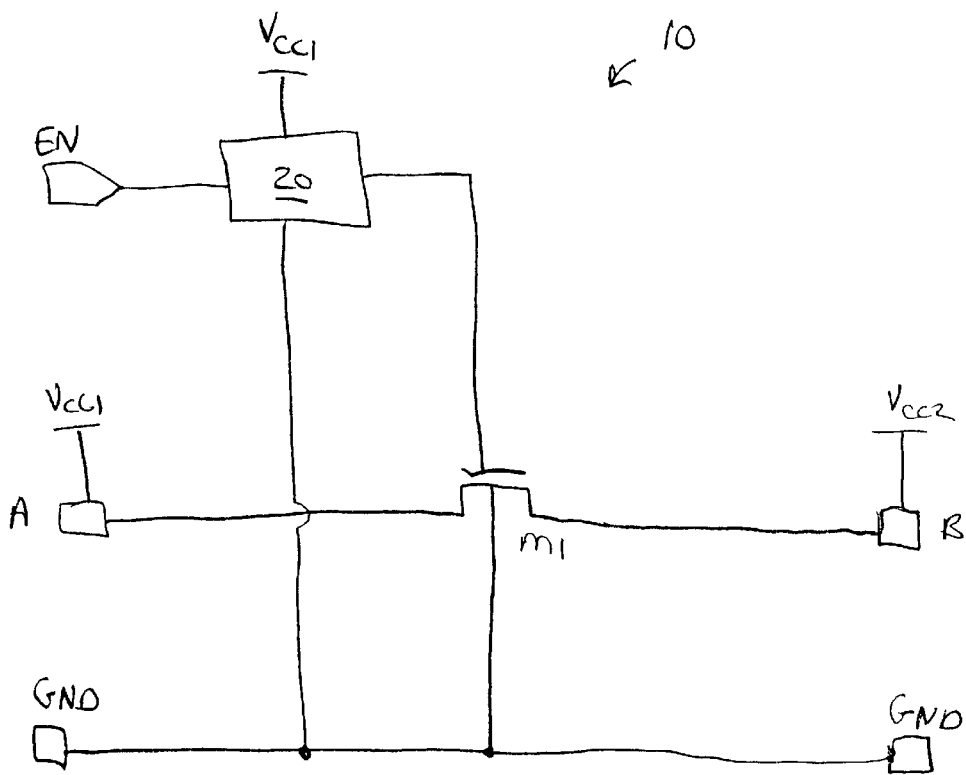
FIG. 3 is a simplified representation of the translation switch circuit of the present invention.

A translation switch circuit 10 of the present invention coupled between a first transfer node A and a second transfer node B is shown in FIG. 3. It is to be understood that node A may be coupled to extended circuitry for receiving electrical signals for propagation through to node B that may also be coupled to extended circuitry. The extended circuitry coupled to node A is powered by a high-potential supply Vcc1 and the extended circuitry coupled to node B is powered by a high-potential supply Vcc2 that is less than the potential associated with Vcc1. Switch circuit 10, for example, may be part of a voltage translating bus such as that shown in FIG. 1.

The switch 10 includes a transfer transistor M1 having a source coupled to node B and a drain coupled to node A. The transistor M1 is preferably an NMOS transistor. The transfer transistor M1 is designed, when enabled, to propagate electrical signals from node A to node B. The transfer transistor M1 includes a bulk or backwell coupled to a low-potential power rail GND that may be common to the extended circuitry associated with nodes A and B. The switch 10 further includes a gate control branch 20 having an output at node C coupled to the gate of transistor M1. The gate control branch 20 is designed to produce, when the potential at node A corresponds to a logic HIGH, at the gate of M1 a potential that is less than the potential at node A yet is high enough to turn M1 on. That potential supplied to the gate of M1 is preferably approximately equivalent to the potential associated with Vcc2. It is to be noted that a plurality of transfer transistors such as transistor M1 may be coupled in parallel to a single gate control branch 20. Alternatively, in order to provide isolation, each transfer transistor may be coupled to its own gate control branch 20.

Figure 4:
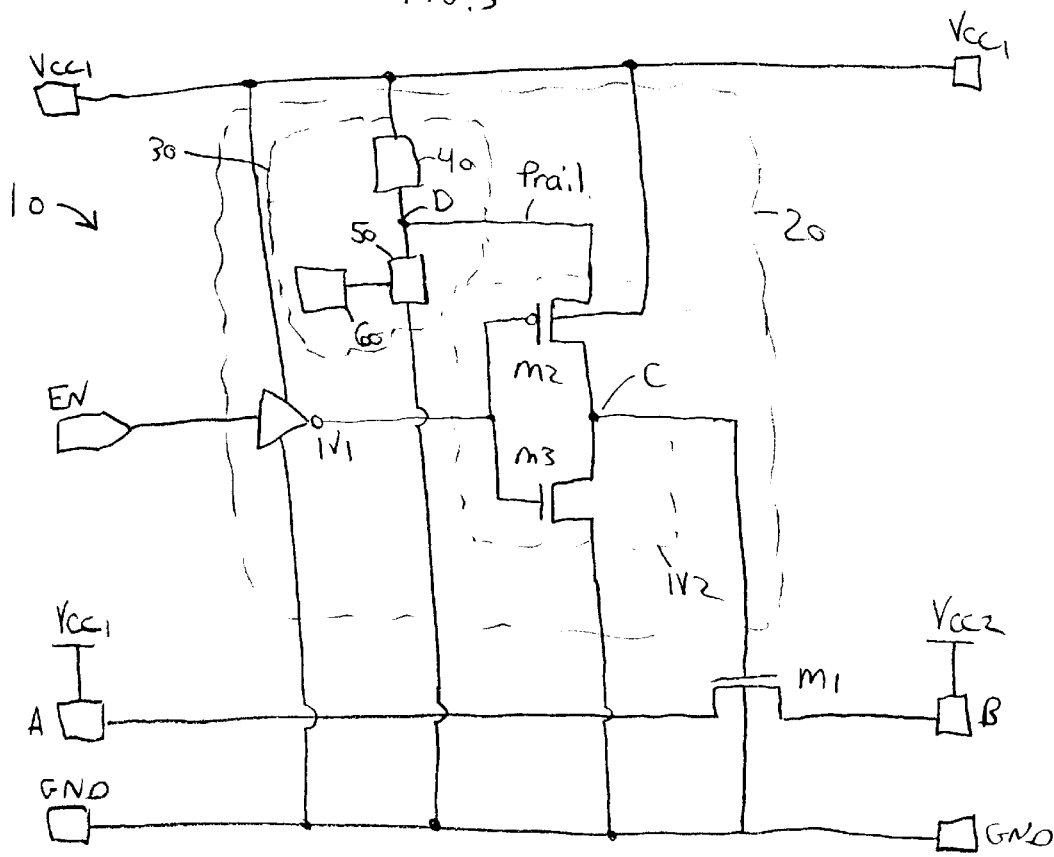
FIG. 4 is a simplified circuit diagram of the translation switch circuit of the present invention, showing the Prail generator subcircuit.

As illustrated in FIG. 4, the gate control branch 20 includes a first inverter IV1 and a second inverter IV2. The first inverter IV1 is coupled between Vcc1 and GND and includes an input coupled to a gate control branch enable signal through node EN. The appropriate signal at node EN determines whether the transfer transistor M1, and thus circuit 10 is able to propagate a signal from A to B. Second inverter IV2 includes a complementary pair of inverter transistors M2 and M3. Transistor M2 is a PMOS transistor having a gate coupled to the output of IV1, a source coupled to a pseudo high potential power rail Prail, and a drain that is, effectively, node C. Transistor M3 is an NMOS transistor having its gate also coupled to the output of IV1, its source coupled to GND, and its drain coupled to node C. The potential of Prail establishes the potential of the output of IV2 to the gate of M1 and so by definition is less than the potential of Vcc1.

With continuing reference to FIG. 4, the potential of Prail is established at node D by way of pseudorail generator circuit 30. The generator circuit 30 includes a voltage regulator or voltage reference 40 that is any sort of tracking voltage reference. The generator circuit 30 further includes a bias pulldown circuit 50 with potential referencing circuit 60. Whereas the prior art simply provided a resistor between Prail and GND, the generator circuit 30 is designed to sink current from Prail when the switch circuit 10 is active. This is of particular advantage under transient switching conditions in that when the potential of Prail increases on a rising edge of an electrical signal transition from logic LOW to logic HIGH, the generator circuit 30 clamps the potential of Prail at a potential suitable for translating signal potential from node A to node B. Moreover, that potential is maintained while sinking current much more rapidly than possible with the simple biasing resistance of the prior art.

Figure 5:
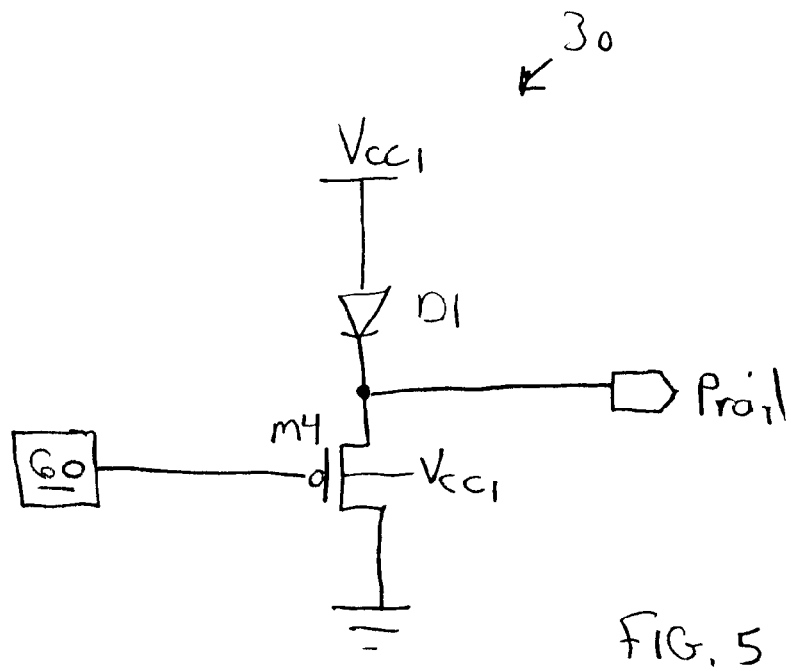
FIG. 5 is a simplified circuit diagram of a first embodiment of the pseudorail signal generator circuit of the translation switch circuit of the present invention.

As illustrated in FIG. 5, the voltage reference 40 and the bias pulldown circuit 50 may be a diode means such as a forward-biased diode D1 and a PMOS transistor M4, respectively. The diode D1 has a high potential node coupled to Vcc1 and a low potential node coupled to Prail. Transistor M4 has a source coupled to the low potential node of D1 and a drain coupled to GND. The gate of M4 is coupled to the output of referencing circuit 60. Referencing circuit 60 is designed to provide a biasing current to the gate of M4 in a manner that allows M4 to quickly sink current from Prail during transient signal changes on a bus such as the bus illustrated in FIG. 1. Whereas the prior art translator switch was best suited to convert signals under steady-state conditions only due to current injection on the common bus to the equivalent to Prail, the combination of the bias pulldown circuit 50 and the referencing circuit 60 result in a translator circuit 10 that can switch transition signals as well with reasonable delay.

Figure 6:
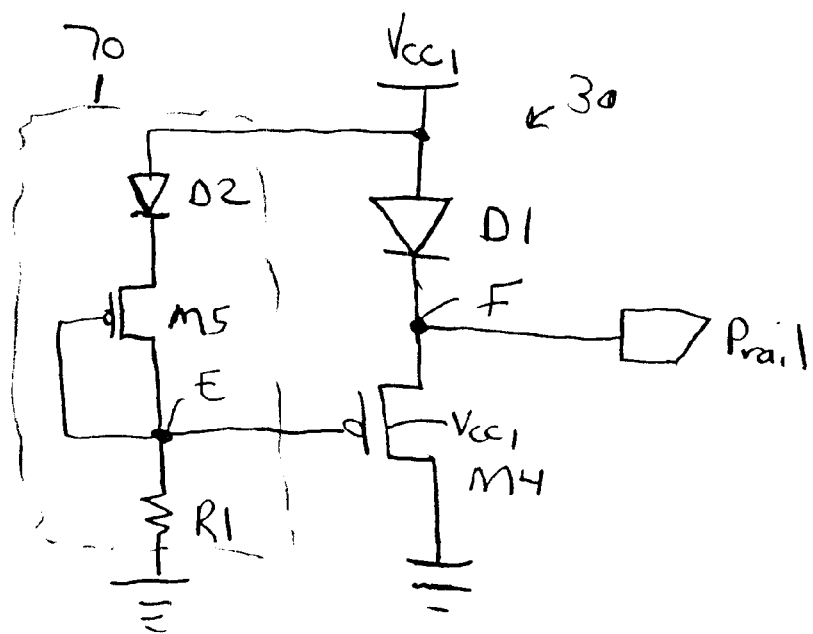
FIG. 6 is a simplified circuit diagram of the pseudorail signal generator circuit of FIG. 5 showing an exemplar biasing reference circuit.

As illustrated in FIG. 6, one embodiment of the referencing circuit 60 includes bias tree 70 having its output coupled to transistor M4. The bias tree 70 is formed of a first voltage reference such as a diode device represented as diode D2, a second diode device such as diode-wired PMOS transistor M5 and resistance R1. It is to be understood that D2 may alternatively be a diode-wired PMOS transistor, a diode-wired NMOS transistor, or a diode-wired bipolar transistor. The active clamp provided by the circuit of FIG. 6 operates as follows to enable translation of an electrical signal from node A to node B during signal transition. The potential of Vcc1 is dropped by the potential across diode D1 and by the potential across the source and drain of transistor M5. Node B will remain at the higher voltage for the LOW-to-HIGH transition unless there is a resistive load pulling it down, or there is a limiting diode clamp pulling its voltage to the voltage associated with a lower voltage supply rail.

Resistor R1 may be selected to regulate the current through tree 70. As a result, the potential at node E is about two Vt drops below Vcc1 and it is that potential that is applied to the gate of M4. With that potential at the gate of transistor M4 and the source of that transistor at about one Vt drop below the potential of Vcc1, due to the drop across diode device D1, transistor M4 is just barely on. It is nevertheless on and available to sink current essentially immediately from Prail. Its response time is much faster than that of the prior resistor-based potential-defining switch. The resultant diode-drop potential at node F, combined with the Vgs potential drop across switch transistor M1, produces the necessary potential translation from node A to node B. Since M5 is biased just barely on, it generates little static Icc current. However, as the current through the D1/M4 branch increases when Prail injects current, transistor M4 turns on more fully and amplifies the current sinking so that it is quickly drawn from Prail. This clamping of Prail translates into a clamping of the potential at the gate of M1.

Of course, it is to be understood that transistor M1 does provide for translation, to an extent. That is, it drops the potential from Vcc by a Vt. However, with diode di, the drop is Vcc-Vt-Vd. The present invention is well suited for the regulation of such greater potential differentials. It is also to be noted that the potential at node B will remain at a higher level unless it is coupled to a resistive load that pulls it down, or to a diode clamp to the lower high-potential rail of the receiving device.

Figure 7:
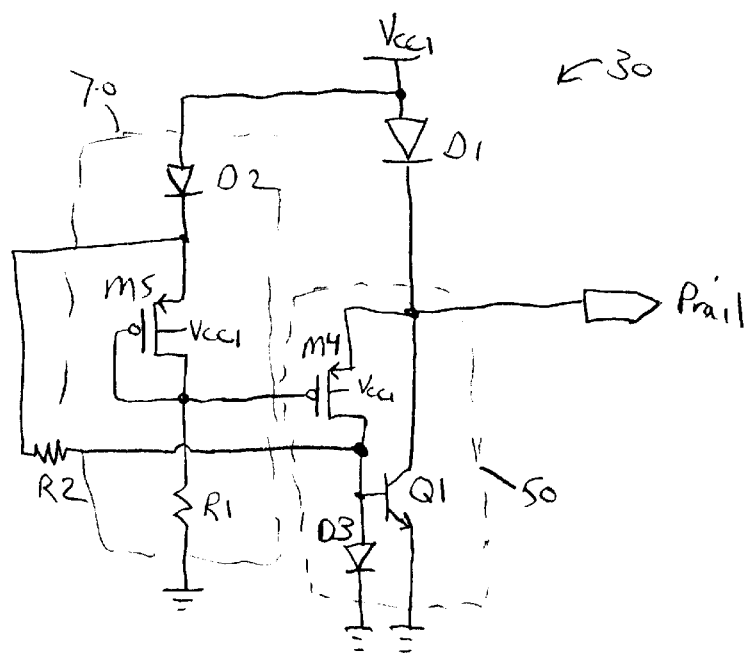
FIG. 7 is a simplified circuit diagram of a second embodiment of the pseudorail signal generator circuit of the translation switch circuit of the present invention.
Figure 8:
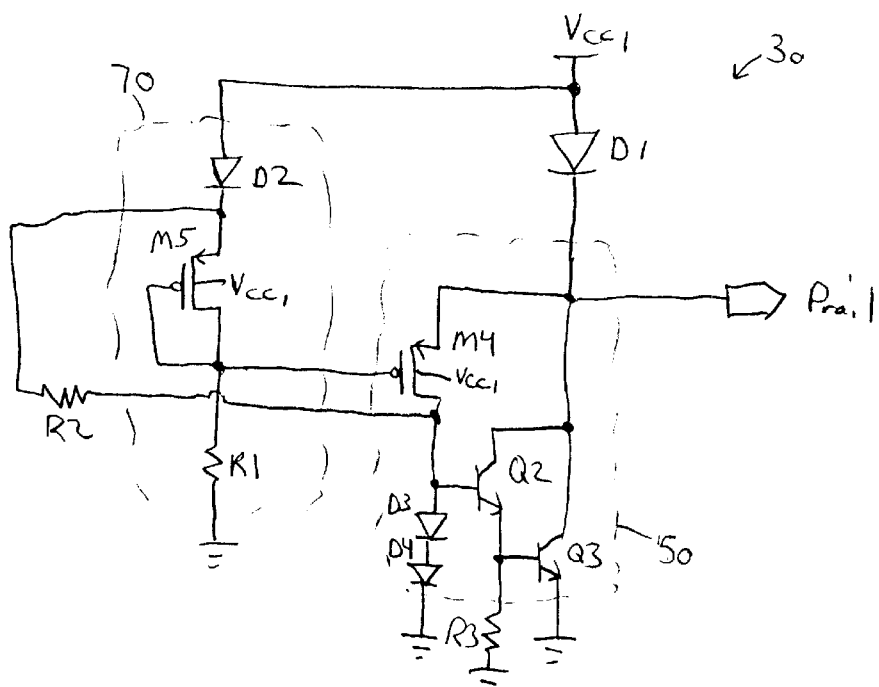
FIG. 8 is a simplified circuit diagram of a third embodiment of the pseudorail signal generator circuit of the translation switch circuit of the present invention.
Figure 9:
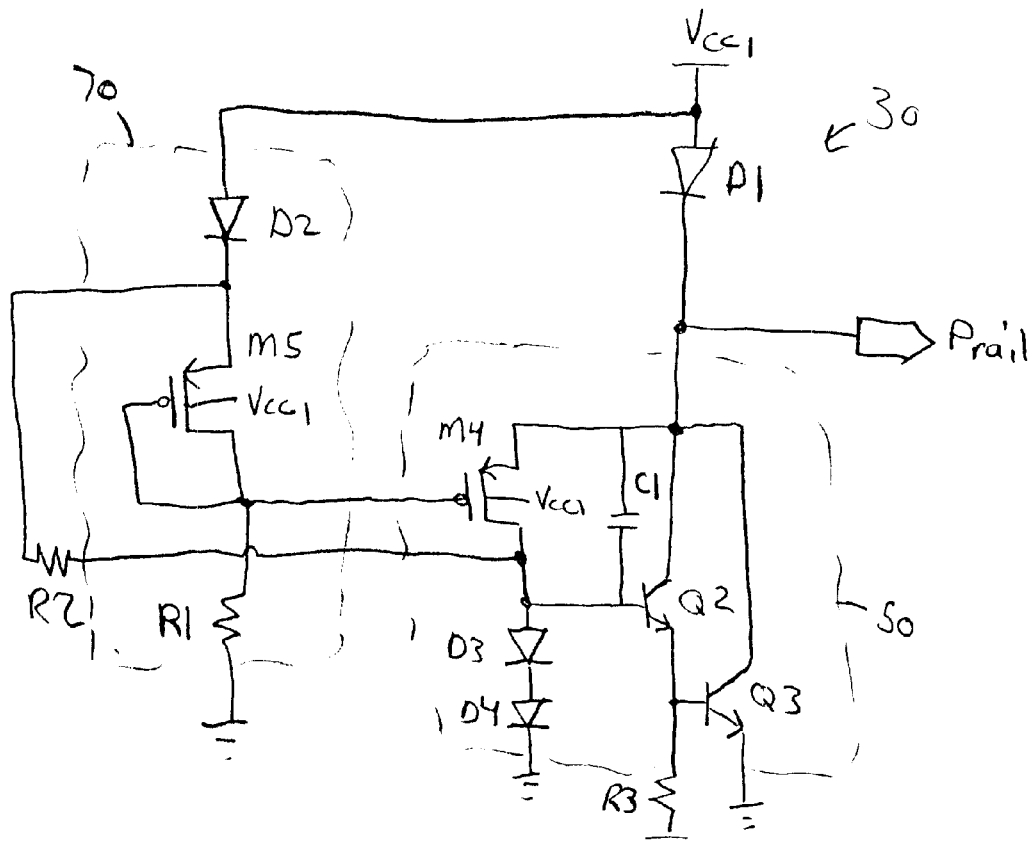
FIG. 9 is a simplified circuit diagram of a fourth embodiment of the pseudorail signal generator circuit of the translation switch circuit of the present invention.

Alternative embodiments of the bias pulldown circuit 50 are shown in FIGS. 7–9. In FIG. 7, the bias pulldown circuit 50 includes the PMOS transistor M4 and an NPN bipolar transistor Q1. The same referencing circuit 60 as previously described may be used to keep transistor M4 barely on, as before. However, rather than sinking current to GND, it is directed to the base of Q1 through the coupling of the drain of transistor M4. As transition current from Prail increases and is passed back to the source of M6, that transistor turns on more fully, increasing the current to the base of Q1 and turning that transistor on completely. The result is a substantial increase in the amount of current sinking from Prail caused by simultaneous signal transitions. That is, the current magnification and conduction speed associated with the operation of a bipolar transistor such as transistor Q1 improves the rate of current diversion from Prail at a rate faster than could be achieved using transistor M4 alone. The circuit of FIG. 7 further includes bias resistor R2 coupled between the low-potential node of D2 and the drain of M4. Additionally, biasing diode D3 has a high-potential node coupled to the base of Q1 and GND. R2 and D3 bias Q1 into a desirable range of operation. They also control the amount of steady-state current through D1 and Q1.

As illustrated in FIG. 8, a second alternative embodiment of the bias pulldown circuit 50 includes pulldown PMOS transistor M4 coupled substantially as before, but with its drain coupled to an NPN Darlington transistor pair established by NPN transistor Q2 and NPN transistor Q3. As is well known to those skilled in the art, a Darlington pair provides more current amplification than a single bipolar transistor. Therefore, the biasing circuit of FIG. 8 provides even greater means to clamp the current associated with events that affect Prail. A modified version of the circuit of FIG. 8 is illustrated in FIG. 9. The biasing circuit shown therein includes in addition to pulldown transistor M4 and the Darlington pair a capacitance device such as capacitor C1 to provide supplemental injection of current into the base of transistor Q2. That may be desirable to turn on the Darlington pair more quickly under transient conditions at Prail than may otherwise be possibly relying solely on the current through transistor M4. Capacitor C1 has a high potential node coupled to Prail and a low-potential node coupled to the gate of transistor Q2. Of course, capacitor C1 may also be coupled between Prail and the base of transistor Q1 of FIG. 7 for the same purpose.

The circuits of FIGS. 8 and 9 further include biasing elements. Specifically, first biasing resistor R2 is coupled between the low-potential node of D2 and the drain of M4. Second biasing resistor R3 is coupled between the emitter of Q3 and GND. First biasing diode D3 has a high-potential node coupled to the base of Q2 and second biasing diode D4 has a high-potential node coupled to the low-potential node of D3 and a low-potential node coupled to GND. The biasing elements described are used to bias the transistors Q2 and Q3 into a desirable range of operation. They also control the amount of steady-state current through D1 and Q2.

Figure 10:
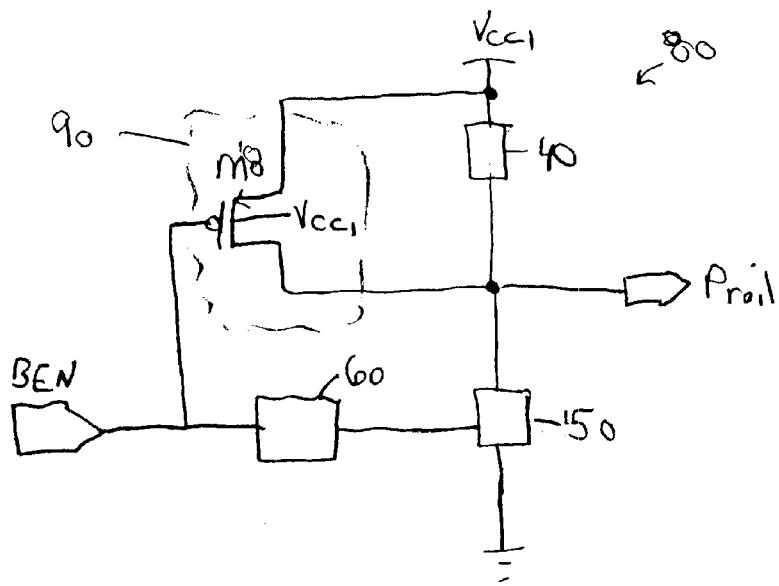
FIG. 10 is a simplified circuit diagram of a selectable biasing bypass circuit.

While the switch translation circuit 10 of the present invention has been shown with its relevant sub-circuitry to rapidly sink the current passing from Prail back to the biasing circuit at all times by keeping transistor M5 ready at all times, it may be desirable to selectively activate that capability. FIG. 10 shows a simplified view of a related generator circuit 80 including a bias bypass branch 90 coupled in parallel with the branch including the diode means 40 and the bias pulldown circuit 50. The bias bypass branch 90 includes a PMOS transistor M8 having a source coupled directly to Vcc1, a drain coupled to Prail, and a gate coupled to bypass enable node BEN. Node BEN may be coupled to any suitable control logic circuitry configured to enable a user to allow the potential associated with high-potential rail Vcc1 be passed via Prail and transfer transistor M1 to the extended circuitry coupled to node B. As shown in FIG. 10, when a logic HIGH is applied to BEN, transistor M8 is off and generator circuit 80 operates substantially as described with respect to the circuit of FIG. 5 in that the 40/50 branch sinks current from Prail. However, with a logic LOW at BEN, transistor M8 is on. The control signal to referencing circuit 60 shuts off the bias pulldown circuit 50. With transistor M8 on and circuit 50 off, biasing is bypassed and substantially full rail potential is applied to Prail and therefore to the gate of M1. It is to be understood that bias bypass branch 90 or its equivalent may be applied to any pseudorail generating circuit, whether of the type provided in the prior art for DC conduction only, or for any of the generator circuits described and shown herein. It is not limited to application to the biasing circuitry described herein.

Figure 11:
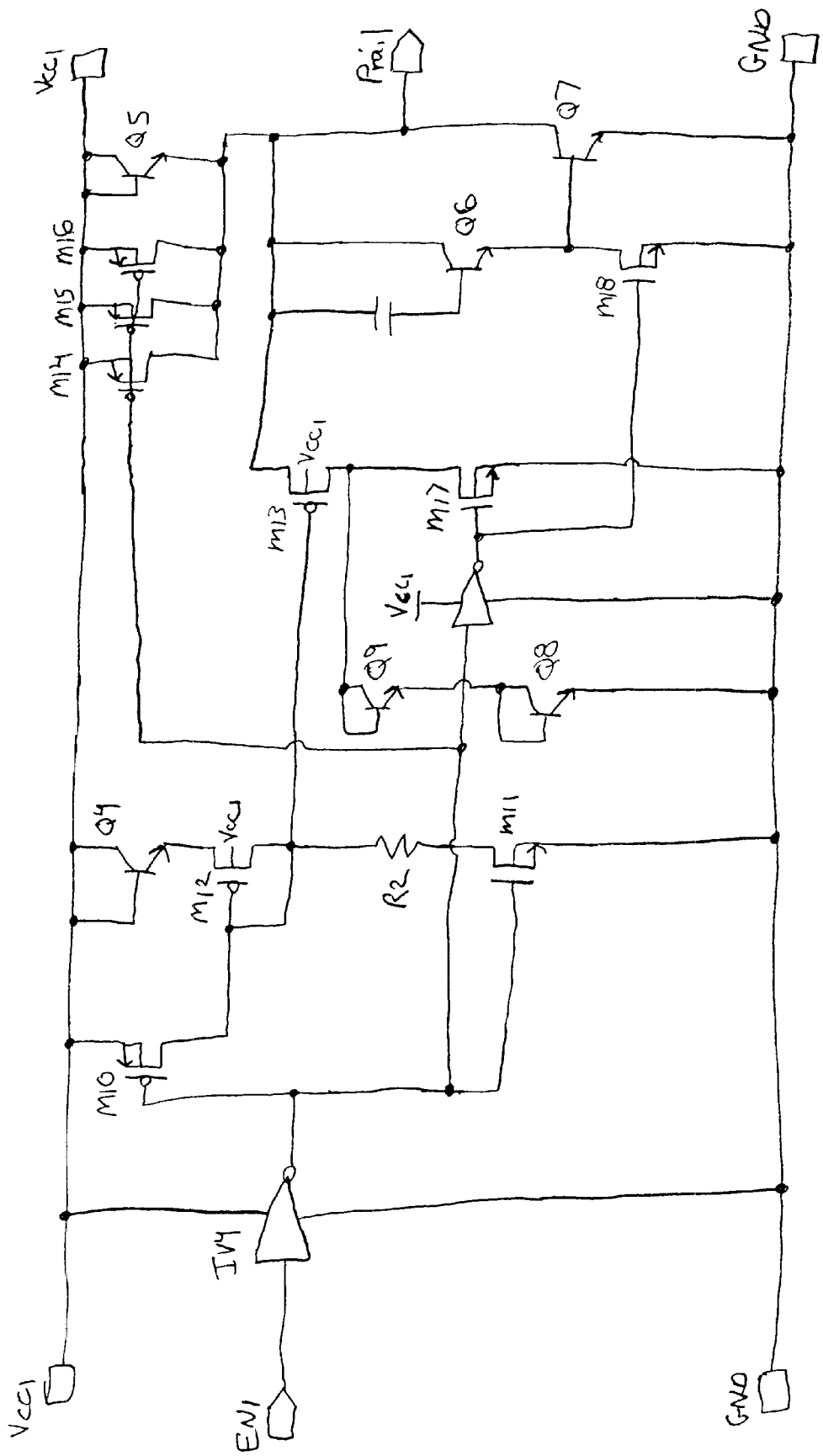
FIG. 11 is a circuit diagram of an embodiment of the pseudorail signal generator circuit of the present invention with biasing and bypass options included.
Figure 1:
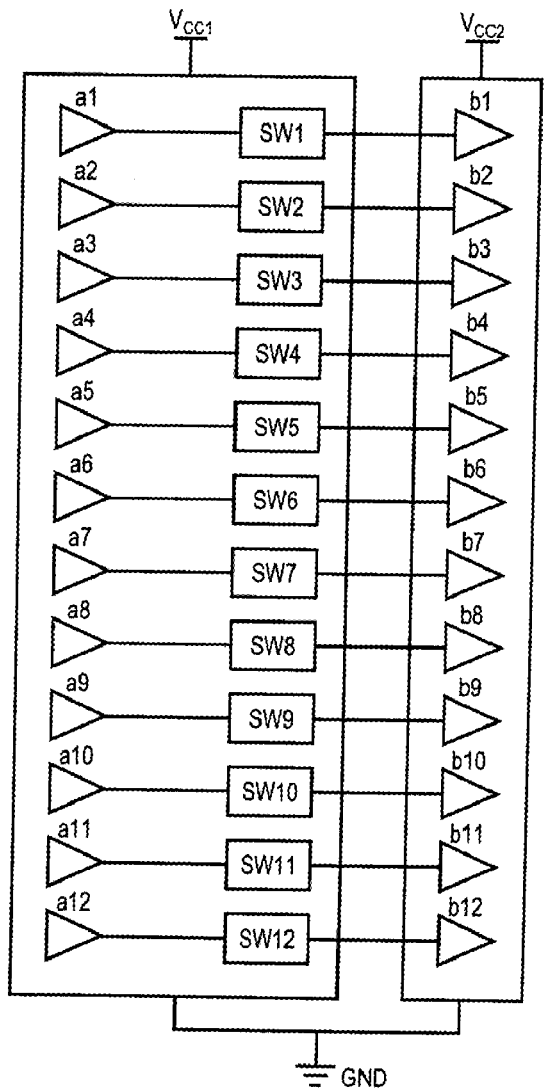
Figure 2:
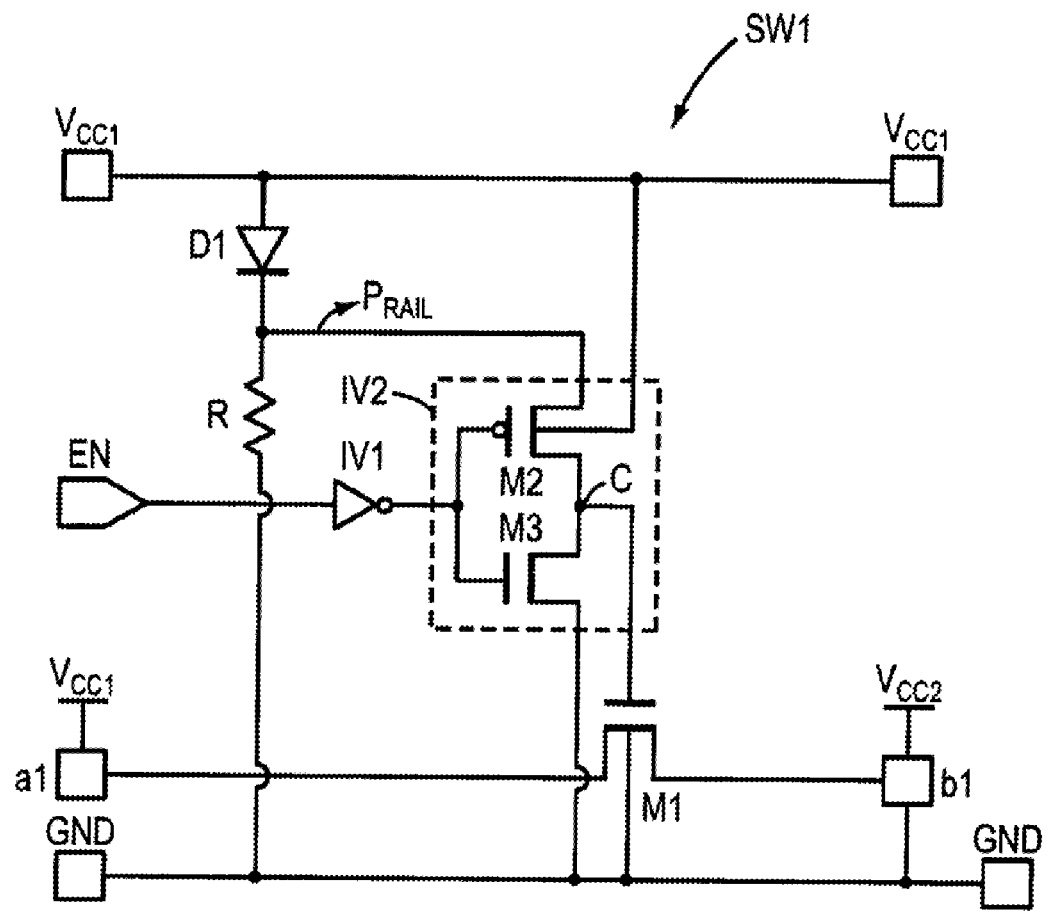
Figure 3:
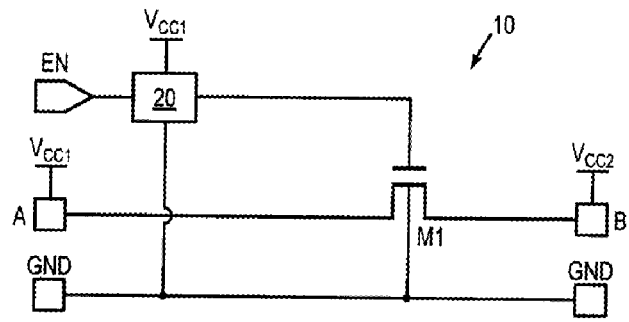
Figure 4:
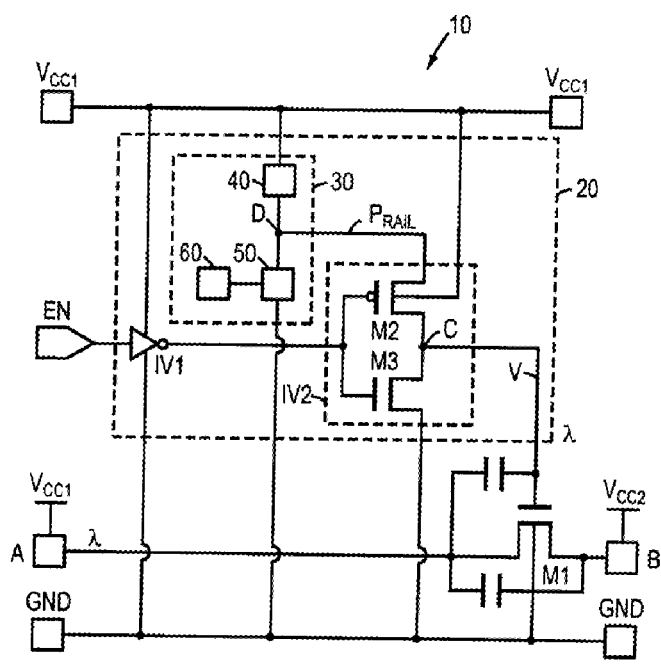
Figure 5:
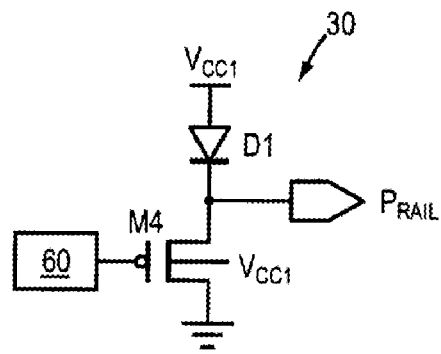
Figure 6:
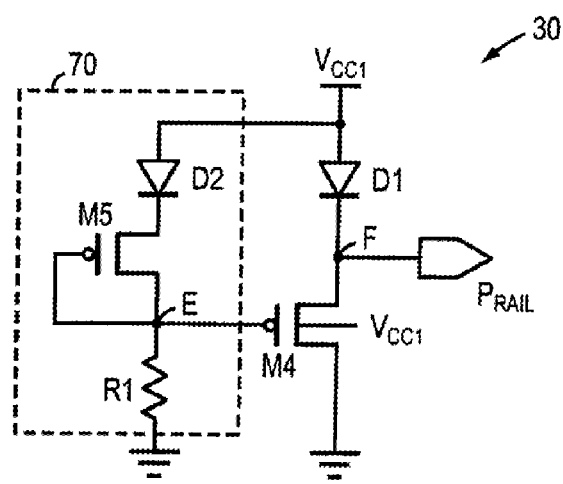
Figure 7:
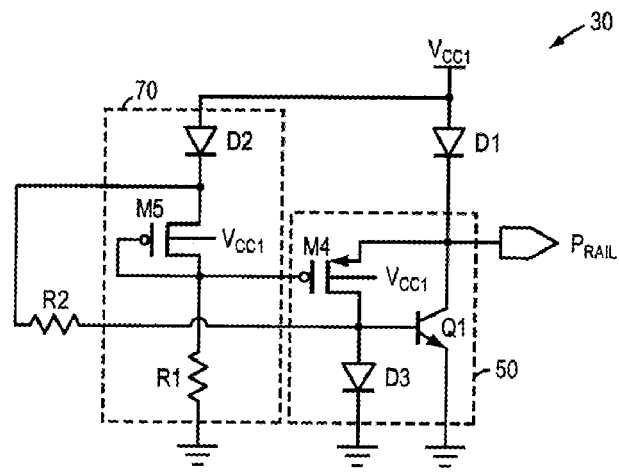
Figure 8:
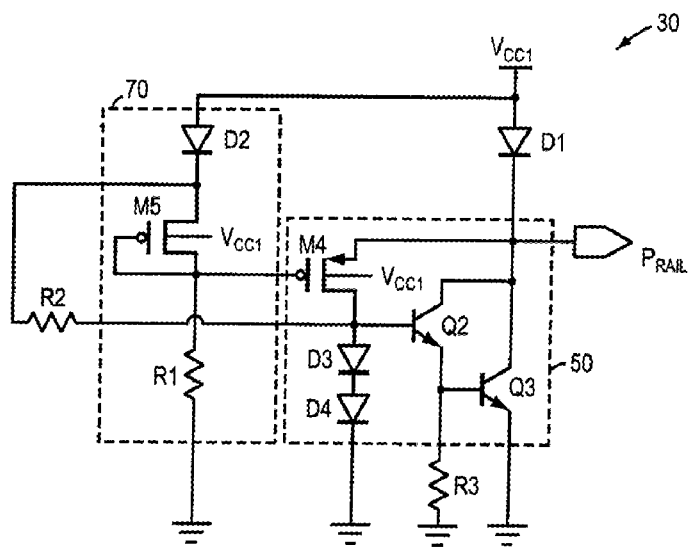
Figure 9:
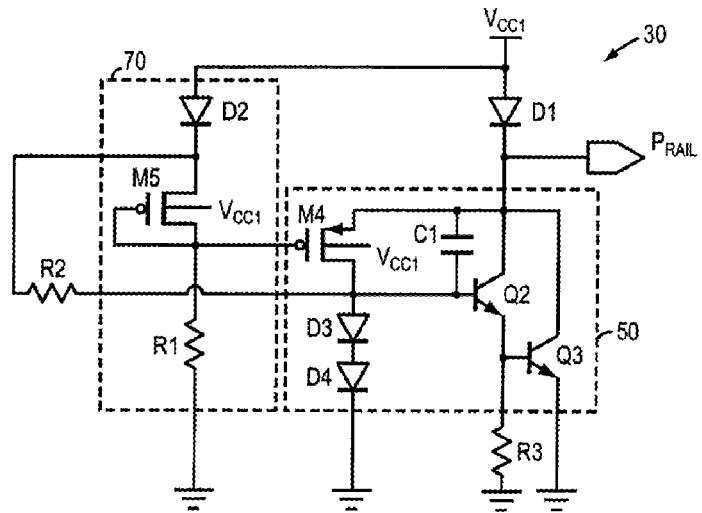
Figure 10:
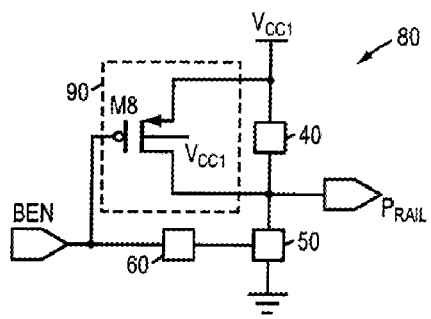
Figure 11:
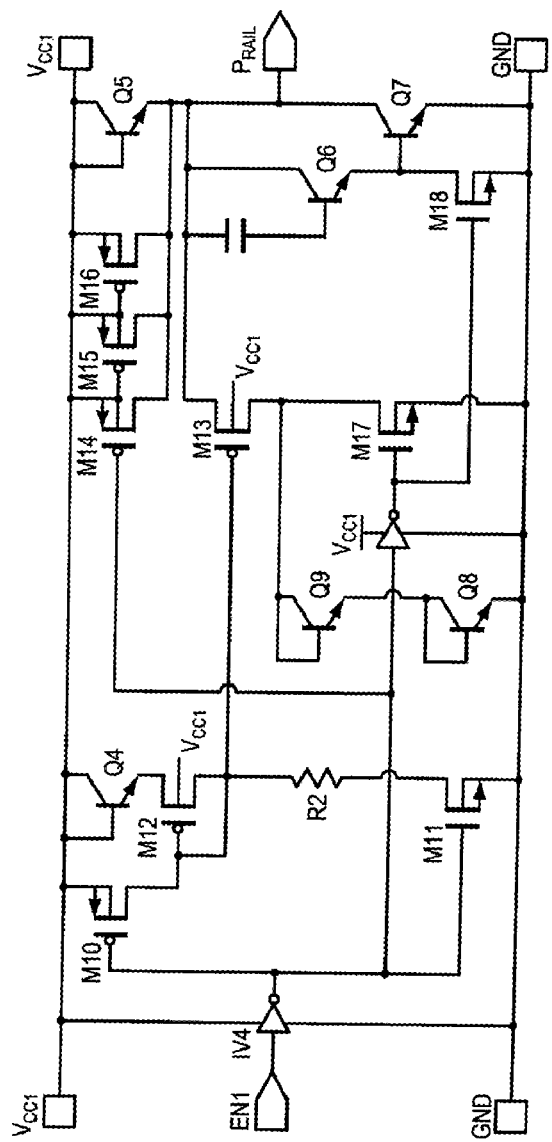

A preferred embodiment of the pseudorail generator of the present invention is shown in FIG. 11 with an enable generator circuit 100. The circuit 100 includes input inverter IV4 coupled between Vcc1 and GND and having an input coupled to generator enable node EN1 that is coupled to a control signal generator (not shown) of the type well known to those skilled in the art. The circuit 100 further includes a first bypass PMOS transistor M10 and a first bypass NMOS transistor M11 coupled to the output of IV4. The circuit 100 also includes a first bias branch formed by diode-wired transistor Q4 and diode-wired PMOS transistor M12 with tail resistor R2. The drain of transistor M12 is coupled to the gate of Prail current sinking transistor M13 in the manner described in regard to generator circuit 80.

With continuing reference to FIG. 11, a second bypass stage formed of PMOS transistors M14–M16 is coupled to Vcc1 and has output drains coupled directly to Prail. It is to be understood that fewer or more bypass transistors may be employed for that stage as a function of the size and configuration of the other components of the circuit 100. Second and third bypass NMOS transistors M17 and M18 having their gates coupled to the output of inverter IV5, have their sources coupled to GND. The drain of M17 is coupled to the drain of sinking transistor M13 and acts to sink any transient current through that branch when the generator circuit 100 is to be disabled. The generator circuit 100 further includes a supplemental sinking branch including a Darlington bipolar transistor pair formed of NPN transistors Q6 and Q7. That Darlington pair amplifies the sinking capability of pulldown transistor M13 in the manner described with respect to generator circuit 80. The Darlington pair is biased by a second bias branch established by diode-wired NPN transistors Q8 and Q9. That second biasing branch supplements the current applied to the base of transistor Q6 to turn them on more quickly and in a stronger manner than may be achieved by the drain of M13 alone. Generator circuit 100 enables rapid and certain sinking of transient current fluctuations at Prail to enable AC translation switching by a switch such as circuit 10.

While the present invention has been described with specific reference to particular embodiments, it is to be understood that all modifications, variants, and equivalents are deemed to be within the scope of the following appended claims.

What is claimed is:

1. A translation switch circuit for translating an electrical signal from a first node to a second node, wherein the first node referenced to by a first power supply having a potential greater than the potential of a second power supply referencing the second node, the circuit comprising:
   a transfer transistor having a drain coupled to the first node and a source coupled to the second node;
   a gate control circuit including a pseudorail generator circuit and an inverter, wherein said pseudorail generator circuit is supplied by the first power supply, and wherein an output of said pseudorail generator circuit is a pseudorail line that is connected to said inverter, and wherein an output of said inverter is coupled to a gate of said transfer transistor; and
   wherein said pseudorail generator circuit includes a voltage reference circuit having a high-potential node coupled to the first power supply and a low-potential node coupled to a bias pulldown circuit, wherein said bias pulldown circuit has an input coupled to a potential referencing circuit that biases said bias pulldown circuit to be on in a steady-state condition and will permit current amplification with a rise in potential of said pseudorail, and wherein said pseudorail is coupled to said low-potential node of said voltage reference circuit.

2. The circuit as claimed in claim 1 wherein said transfer transistor is an NMOS transistor.

3. The circuit as claimed in claim 1 wherein maid voltage reference circuit is a diode means.

4. The circuit as claimed in claim 3 wherein said bias pulldown circuit is a PMOS transistor having its gate coupled to said potential referencing circuit.

5. The circuit as claimed in claim 4 wherein said potential referencing circuit includes a first diode referencing device having a high-potential node coupled to the first power supply and a low-potential node coupled to a high-potential node of a second diode referencing device, wherein said second diode referencing device has a low-potential node coupled to a resistance and to said gate of said PMOS transistor.

6. The circuit as claimed in claim 5 wherein said first diode referencing device is a diode.

7. The circuit as claimed in claim 5 wherein said second diode referencing device is a diode-wired PMOS transistor.

8. The circuit as claimed in claim 5 wherein said resistance is a resistor.

9. The circuit as claimed in claim 1 wherein said voltage reference circuit is a diode means arid said bias pulldown circuit includes a PMOS transistor having a source coupled to a low-potential node of said diode means, a gate coupled to said potential referencing circuit, and a drain coupled to a base of bipolar transistor, wherein said bipolar transistor collector is coupled to said pseudorail.

10. The circuit as claimed in claim 1 wherein said voltage reference circuit is a diode means and said bias pulldown circuit includes a PMOS transistor having a source coupled to the low-potential node of said diode means, a gate coupled to said potential referencing circuit, and a drain coupled to a Darlington transistor pair.

11. The circuit as claimed in claim 10 wherein said Darlington transistor pair includes a first bipolar transistor and a second bipolar transistor, wherein said first bipolar transistor includes a base coupled to said drain of said PMOS transistor, a collector coupled to said pseudorail, and an emitter coupled to a base of said second bipolar transistor, wherein said second bipolar transistor includes a collector coupled to said pseudorail.

12. The circuit as claimed in claim 11 further comprising a capacitor coupled between said source of said PMOS transistor and said base of said first bipolar transistor.

13. The circuit as claimed in claim I further comprising a bias bypass branch coupled in parallel with said voltage reference circuit.

14. The circuit as claimed in claim 15 wherein said bias bypass branch includes a PMOS transistor having a source coupled to the first power supply and a drain coupled to said pseudorail, wherein a gate of said PMOS transistor is coupled to enable circuitry.

15. The circuit as claimed in claim 1 further comprising a bias bypass branch coupled between the first power supply and said pseudorail.

16. The circuit as claimed in claim 15 wherein said bias bypass branch includes a PMOS transistor having a source coupled to the first power supply and a drain coupled to said pseudorail.

17. The circuit as claimed in claim 15 wherein said bias bypass branch includes a PMOS transistor having a source coupled to the first supply rail and a drain coupled to said pseudorail, wherein a gate of said PMOS transistor is coupled to enable circuitry.

18. A computer system including one or more devices requiring the propagation and translation of one or more electrical signals between a first node and a second node, wherein the first node is powered by a first power supply and the second node is powered by a second power supply at a potential less than the potential of the first power supply, the computer system comprising a translation switch circuit as defined in claim 1.

19. A method for translating an electrical signal from a first node to a second node, wherein the first node is referenced to a first power supply having a potential greater than the potential of a second power supply referencing the second node, the method comprising the steps of:
   coupling a transfer transistor between the first node and the second node;
   generating a pseudorail potential that is below the potential of the first power supply; said generating a pseudorail potential includes the steps of,
      coupling a high potential node of a voltage reference circuit to the first power supply;
      coupling a high potential node of a bias pulldown circuit to a low potential node of said voltage reference;

coupling said high potential node of said bias pulldown circuit to a pseudorail potential node; and coupling a control node of said bias pulldown circuit to an active referencing circuit, and actively clamping said pseudorail potential; and coupling said pseudorail potential to a control node of said transfer transistor.

20. The circuit as claimed in claim 19 wherein said voltage reference circuit is a diode means.

21. The method as claimed in claim 20 wherein said bias pulldown circuit includes a PMOS transistor having its source coupled to said diode means and its gate coupled to said active referencing circuit.

22. The method as claimed in claim 21 wherein said bias pulldown circuit further includes a bipolar transistor having a base coupled to a drain of said PMOS transistor and a collector coupled to said diode means.

23. The method as claimed in claim 21 wherein said bias pulldown circuit further includes a Darlington transistor pair having a control node coupled to a drain of said PMOS transistor.

24. The method as claimed in claim 21 wherein said active referencing circuit includes a first diode means having a high-potential node coupled to the first power supply and a low-potential node coupled to a second diode means, wherein a low-potential node of said second diode means is coupled to a resistance and to said gate of said PMOS transistor.

25. The method as claimed in claim 19 further comprising the step of enabling selective bypass of the step of actively clamping said pseudorail potential.

26. The method as claimed in claim 25 wherein the step of enabling selective bypass of active clamping includes the steps of coupling a source of a PMOS transistor to the first power supply, coupling a drain of said PMOS transistor to said pseudorail potential and coupling a gate of said PMOS transistor to enable logic circuitry.

* * * * *

UNITED STATES PATENT AND TRADEMARK OFFICE
CERTIFICATE OF CORRECTION

| | | |
|---|---|---|
| PATENT NO. | : 6,433,613 B1 | |
| APPLICATION NO. | : 09/737977 | |
| DATED | : August 13, 2002 | |
| INVENTOR(S) | : Goodell et al. | |

It is certified that error appears in the above-identified patent and that said Letters Patent is hereby corrected as shown below:

The title page, showing illustrative figure, should be deleted and substitute therefore the attached title page.

Delete the drawing sheets 1-11, and substitute therefor the drawing sheets consisting of figures 1-11, as shown on the attached pages.

Signed and Sealed this

Twenty Second Day of April, 2008

JON W. DUDAS
*Director of the United States Patent and Trademark Office*

(12) United States Patent
Goodell et al.

(10) Patent No.: US 6,433,613 B1
(45) Date of Patent: Aug. 13, 2002

(54) TRANSLATING SWITCH CIRCUIT WITH DISABLING OPTION

(75) Inventors: Trenor Goodell, Peaks Island; James Boomer, Falmouth, both of ME (US)

(73) Assignee: Fairchild Semiconductor Corporation, South Portland, ME (US)

(*) Notice: Subject to any disclaimer, the term of this patent is extended or adjusted under 35 U.S.C. 154(b) by 0 days.

(21) Appl. No.: 09/737,977

(22) Filed: Dec. 15, 2000

(51) Int. Cl.[7] .................................................. H03K 17/687
(52) U.S. Cl. ...................... 327/427; 327/387; 327/389; 326/57
(58) Field of Search .................................. 327/419, 427, 327/379, 384, 387, 389, 530, 534, 535, 309, 310, 391; 326/49, 57

(56) References Cited

U.S. PATENT DOCUMENTS 5,963,080 A * 10/1999 Miske et al. ............... 327/534
6,052,019 A * 4/2000 Kwong ...................... 327/437
6,256,182 B1 * 7/2001 Suzuki et al. .............. 361/93.9

* cited by examiner

Primary Examiner—Timothy P. Callahan
Assistant Examiner—Minh Nguyen
(74) Attorney, Agent, or Firm—Cesari and McKenna, LLP; Edwin H. Paul, Esq.

(57) ABSTRACT

A translation switch is described with a transfer MOS transistor that connects a first node to second node where the first node is referenced to a higher voltage than is the second. A pseudo-rail generator drives the gate of the MOS transistor and provides a p-rail reference voltage lower in voltage to that of the first node. The generator includes a selectively enabled active clamping circuit that clamps the gate of the MOS transfer transistor to the p-rail potential and sinks current from the p-rail when higher voltages appear on the p-rail to thereby maintain the p-rail at a substantially constant potential.

26 Claims, 7 Drawing Sheets

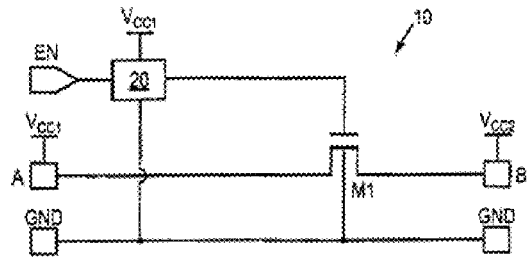

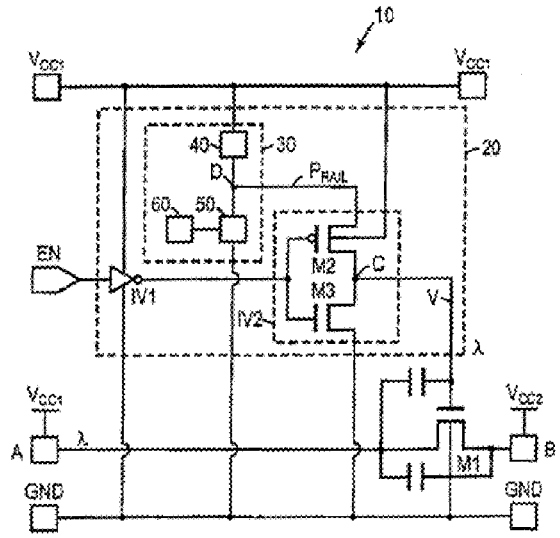

UNITED STATES PATENT AND TRADEMARK OFFICE
CERTIFICATE OF CORRECTION

PATENT NO. : 6,433,613 B1
APPLICATION NO. : 09/737977
DATED : August 13, 2002
INVENTOR(S) : Trenor F. Goodell It is certified that error appears in the above-identified patent and that said Letters Patent is hereby corrected as shown below:

On the title page of the patent, please correct the inventor information as shown below:

(75) Inventors: Trenor Goodell, Peaks Island; James Boomer, Falmouth, Brent Rowe, Cumberland, both all of ME (US)

Signed and Sealed this

Twenty-first Day of December, 2010

David J. Kappos
*Director of the United States Patent and Trademark Office*